(12) United States Patent
Storck et al.

(10) Patent No.: US 10,192,739 B2
(45) Date of Patent: Jan. 29, 2019

(54) LAYERED SEMICONDUCTOR SUBSTRATE WITH REDUCED BOW HAVING A GROUP III NITRIDE LAYER AND METHOD FOR MANUFACTURING IT

(75) Inventors: Peter Storck, Burghausen (DE); Guenter Sachs, Burghausen (DE); Ute Rothammer, Mehring (DE); Sarad Bahadur Thapa, Burghausen (DE); Helmut Schwenk, Burghausen (DE); Peter Dreier, Tittmoning (DE); Frank Muemmler, Emmerting (DE); Rudolf Mayrhuber, Radegund (AT)

(73) Assignee: SILTRONIC AG, Munich (DE)

( * ) Notice: Subject to any disclaimer, the term of this patent is extended or adjusted under 35 U.S.C. 154(b) by 1317 days.

(21) Appl. No.: 14/114,056

(22) PCT Filed: May 23, 2012

(86) PCT No.: PCT/EP2012/059581
§ 371 (c)(1),
(2), (4) Date: Oct. 25, 2013

(87) PCT Pub. No.: WO2013/000636
PCT Pub. Date: Jan. 3, 2013

(65) Prior Publication Data
US 2014/0048848 A1 Feb. 20, 2014

(30) Foreign Application Priority Data

Jun. 30, 2011 (EP) .................................. 11172250
Dec. 1, 2011 (EP) .................................. 11191535

(51) Int. Cl.
*C30B 25/02* (2006.01)
*H01L 21/02* (2006.01)
(Continued)

(52) U.S. Cl.
CPC .... *H01L 21/02587* (2013.01); *H01L 21/0245* (2013.01); *H01L 21/0254* (2013.01);
(Continued)

(58) Field of Classification Search
CPC ......... C30B 25/00; C30B 25/02; C30B 25/18; C30B 25/183; C30B 25/20; C30B 29/00;
(Continued)

(56) References Cited

U.S. PATENT DOCUMENTS

| 4,830,984 A | 5/1989 | Purdes |
| 2003/0132433 A1* | 7/2003 | Piner ....................... C30B 23/02 257/19 |

(Continued)

FOREIGN PATENT DOCUMENTS

| DE | 102006057064 A1 | 5/2008 |
| JP | 1-218009 A | 8/1989 |

(Continued)

OTHER PUBLICATIONS

Lin, et al. publication entitled "Misfit stress in P/P+ epitaxial silicon wafers: Effect and elimination," VLSI Technology, Systems, and Applications; Proceedings of Technical Papers, International Symposium in Taipei, Taiwan; pp. 57-60, May 22, 1991.*

(Continued)

*Primary Examiner* — Kenneth A Bratland, Jr.
(74) *Attorney, Agent, or Firm* — Brooks Kushman P.C.

(57) ABSTRACT

A layered semiconductor substrate has a monocrystalline first layer based on silicon, having a first thickness and a first lattice constant $a_1$ determined by a first dopant element and a first dopant concentration, and in direct contact therewith, a monocrystalline second layer based on silicon, having a second thickness and a second lattice constant $a_2$, determined by a second dopant element and a second dopant concentration, and a monocrystalline third layer comprising (Continued)

a group III nitride, the second layer located between the first layer and the third layer, wherein $a_2 > a_1$, wherein the crystal lattice of the first layer and the second layer are lattice-matched, and wherein the bow of the layered semiconductor substrate is in the range from −50 μm to 50 μm.

13 Claims, 1 Drawing Sheet

(51) Int. Cl.
*H01L 21/78* (2006.01)
*H01L 29/205* (2006.01)

(52) U.S. Cl.
CPC .. *H01L 21/02381* (2013.01); *H01L 21/02617* (2013.01); *H01L 21/78* (2013.01); *H01L 29/205* (2013.01); *H01L 21/0262* (2013.01); *H01L 21/02573* (2013.01)

(58) Field of Classification Search
CPC ..... C30B 29/10; C30B 29/403; C30B 29/406; H01L 21/02381; H01L 21/0245; H01L 21/02458; H01L 21/0254; H01L 21/02573; H01L 21/02587; H01L 21/02617; H01L 21/0262
USPC .................. 117/84, 88–90, 94–95, 101, 102, 117/105–106, 902, 937, 952
See application file for complete search history.

(56) References Cited

U.S. PATENT DOCUMENTS

| | | |
|---|---|---|
| 2003/0136333 A1 | 7/2003 | Semond et al. |
| 2004/0089225 A1 | 5/2004 | Ono et al. |
| 2004/0132227 A1 | 7/2004 | Horning et al. |
| 2006/0057856 A1 | 3/2006 | Senda et al. |
| 2007/0261633 A1 | 11/2007 | Tanaka |
| 2008/0017952 A1 | 1/2008 | Cody et al. |
| 2008/0173895 A1 | 7/2008 | Maa et al. |
| 2009/0236695 A1 | 9/2009 | Storck et al. |
| 2010/0155728 A1* | 6/2010 | Cha ............... H01L 21/02381 257/49 |
| 2012/0032229 A1 | 2/2012 | Deai et al. |

FOREIGN PATENT DOCUMENTS

| | | |
|---|---|---|
| JP | 2003-86520 | 3/2003 |
| JP | 2005-079134 A | 3/2005 |
| JP | 2009-545169 A | 12/2009 |
| JP | 2010-272781 A | 12/2010 |
| JP | 2011-103380 A | 5/2011 |

OTHER PUBLICATIONS

Lin, et al. publication entitled "Misfit stress in P/P+ epitaxial silicon wafers: Effect and elimination," VLSI Technology, Systems, and Applications; Proceedings of Technical Papers, International Symposium in Taipei, Taiwan; pp. 57-60, May 22, 1991. (Year: 1991).*
Frank and Van Der Merwe, "One Dimensional Dislocations. II. Misfitting Monolayers and Oriented Overgrowth", Proc. Roy. Soc. Lond. A 1949 198; published Aug. 15, 1949, pp. 216-225.
Freund, L.B. et al., "Extensions of the Stoney Formula for Substrate Curvature to Configurations with Thin Substrates or Large Deformations", Applied Physics Letter, 74, (No. 14) 1987 (1999); doi: 10 1063/1.123722. (pp. 1987-1989.).
Lin W. et al., "Misfit Stress in P/P+ Epitaxial Silicon Wafers: Effect and Elimination", VLSI Technology, Systems, and Applications, 1991. Proceedings of Technical Papers, 1991 International Symposium on Taipai, Taiwan May 22-24, 1991, New York, NY, USA, IEEE, US, May 22, 1991 (May 22, 1991), pp. 57-60, XP010045248, DOI: 10.1109/VTSA.1991.246712 ISBN: 978-0/7803-0036-1 Section "Abstract", "Introduction,".

* cited by examiner

Fig. 1 - Prior Art
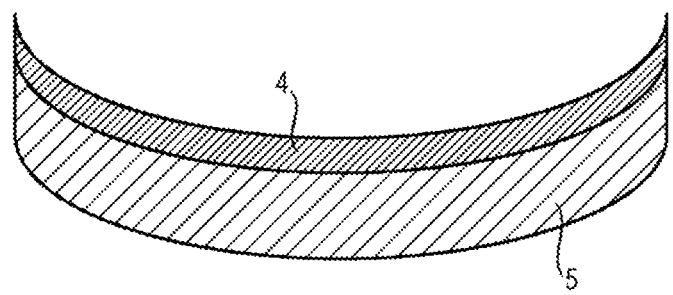
Fig. 2
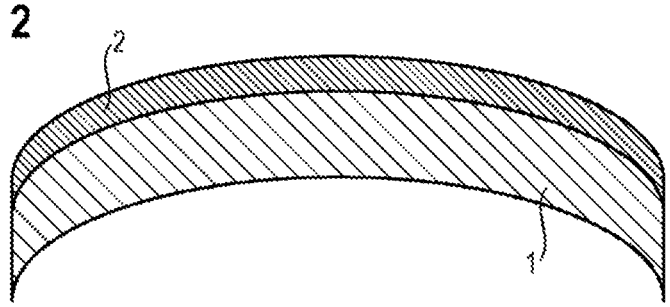
Fig. 3
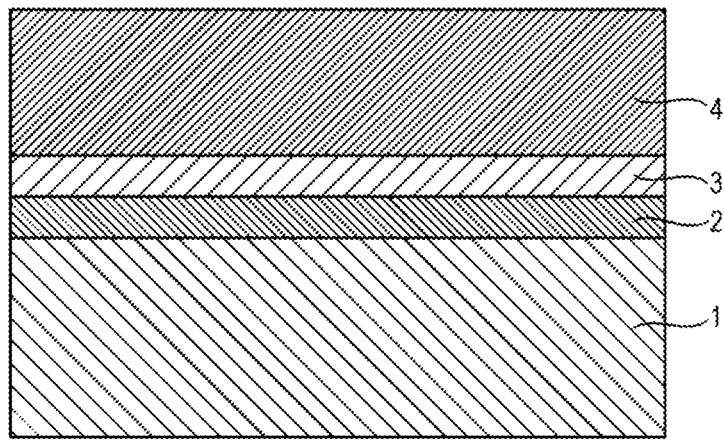

LAYERED SEMICONDUCTOR SUBSTRATE WITH REDUCED BOW HAVING A GROUP III NITRIDE LAYER AND METHOD FOR MANUFACTURING IT

CROSS-REFERENCE TO RELATED APPLICATIONS

This application is the U.S. National Phase of PCT Appln. No. PCT/EP2012/059581 filed May 23, 2012, which claims priority to European Application No. EP 11191535.1 filed Dec. 1, 2011, and European Application No. EP 11172250.0 filed Jun. 30, 2011, the disclosures of which are incorporated in their entirety by reference herein.

BACKGROUND OF THE INVENTION

1. Field of the Invention

The invention is related to a layered semiconductor substrate comprising silicon which can be used as a substrate for the deposition of a group III nitride layer, and to a method for manufacturing the substrate.

2. Description of the Related Art

There are several fundamental issues for gallium nitride (GaN) layers epitaxially deposited on silicon (Si) substrates (GaN-on-Si layer structures) arising from the material mismatch between GaN and Si(111). For example, the thermal expansion coefficient (TEC) of GaN is larger than that of silicon. The same holds for the nitrides of the other elements of group 3 of the periodic table. This difference in thermal expansion coefficient causes extensive concave bowing of the wafer during cool-down from the deposition temperature of the group III nitride layer to room temperature. The amount of bow increases with increasing thickness of the group III nitride layer. If bow of the wafer is too high, further processing is not possible. Therefore bow has to be kept low.

Several solutions have been proposed. State-of-the-art is the deposition of intermediate layers within the GaN layer stack that generate compressive stress, e.g. aluminium nitride (AlN) intermediate layers deposited at low temperature. US2003/0136333A1, for example, discloses the deposition of several AlN intermediate layers within the stack of GaN layers on a silicon substrate. AlN has a smaller lattice constant than GaN. Therefore, a GaN layer grown on AlN is in compression during growth. This compression compensates the tensile stress that occurs during cooling. This allows thick and crack-free GaN layers to be grown on a silicon substrate.

The AlN layer has to be deposited at a low temperature which results in a low growth rate. Therefore, the deposition of the AlN layer is very time-consuming. Furthermore, the deposition of the GaN layer, which takes place at a relatively high temperature of about 1100° C., has to be interrupted. The temperature decreases and increases between the GaN and AlN deposition steps take additional time. A further disadvantage is the additional stress created in the GaN layer by the AlN intermediate layers, which causes an increase of the defect density in the GaN layer.

Alternatively, one or more layers can be deposited on the back side of the wafer that generate bow opposing the bow contribution from the GaN layer on the wafer front side. U.S. Pat. No. 4,830,984 teaches to deposit a layer of a metal (e.g. tungsten) silicide on the back side of a silicon substrate wafer and annealing it so as to form a warped structure having a convex front surface. Thereafter, a gallium arsenide (GaAs) layer is deposited on the front side of the silicon substrate wafer. When cooling the structure down to room temperature, both layers, the GaAs layer on the front side and the metal silicide layer on the back side exert tensioning forces on their respective sides of the silicon substrate wafer, resulting in an approximately planar surface of the GaAs layer. The deposition of a stressed backside layer requires the addition of several process steps (deposition of backside layer (potentially flipping the wafer), etching of edge and front side to remove deposits, additional polishing of the front side) which adds to complexity and cost of the manufacturing. In addition, non-Si backsides are a source of contamination for all further processing steps.

The problem to be solved by the invention is therefore to provide a high-quality group III nitride layer having a small bow, the production of which is less time-consuming than the known structures.

SUMMARY OF THE INVENTION

The problem is solved by a layered semiconductor substrate comprising a monocrystalline first layer 1 containing at least 80% silicon and having a first thickness and a first lattice constant $a_1$, the first lattice constant $a_1$ being determined by a first dopant element and a first dopant concentration and a monocrystalline second layer 2 containing at least 80% silicon and having a second thickness and a second lattice constant $a_2$, the second lattice constant $a_2$ being determined by a second dopant element and a second dopant concentration, the second layer 2 being in direct contact with the first layer, and a monocrystalline third layer 4 comprising a group III nitride, such that the second layer is located between the first layer and the third layer, wherein the second lattice constant $a_2$ is larger than the first lattice constant $a_1$, wherein the crystal lattice of the first layer 1 and the second layer 2 are lattice-matched and wherein the bow of the layered semiconductor substrate is in the range from −50 μm to 50 μm.

BRIEF DESCRIPTION OF THE DRAWINGS

FIG. 1 diagrammatically depicts a group III nitride layer deposited on a silicon substrate (not according to the present invention).

FIG. 2 diagrammatically depicts an intermediate product of the layered semiconductor substrate according to the present invention prior to the deposition of the group III nitride layer.

FIG. 3 diagrammatically depicts a layered semiconductor substrate according to the present invention, comprising a first and a second silicon-based layer, an intermediate layer and a group III nitride layer.

DETAILED DESCRIPTION OF THE PREFERRED EMBODIMENTS

Contrary to the prior art, the present invention uses a completely silicon-based stack of layers to generate stress in order to compensate the stress exerted by the group III nitride layers which are to be deposited on the substrate.

According to the present invention, the composition of the second layer of the substrate is modified with regard to the first layer by adding at least one element to at least one of the layers that creates a lattice mismatch between the second and the first layer. The dopant elements and their concentrations are selected in a way that the lattice constant of the second layer is bigger than the lattice constant of the first layer. In this specification, the term "lattice constant" is understood to be the lattice constant of the material when its crystal lattice is relaxed. If the material forms a strained heteroepitaxial layer as in case of the second layer 2 deposited on the first layer 1, its actual in-plane lattice constant deviates from the lattice constant of the material in a relaxed state. By adjusting the dopant elements, the concentrations of the dopant elements (hereafter referred to as "dopant concentrations") and the thickness of the first and second layer, a certain amount of stress is generated resulting in a convex bowing of the wafer. The amount of stress that is generated in the substrate is enough to counterbalance the stress resulting from the group III nitride layer which is deposited on or above the second layer of the substrate.

The invention can also be combined with other techniques to reduce bow, e.g. the prior-art techniques described above or the use of a preferential bow on the substrate.

The advantages of the present invention are an improved quality of the group III nitride layer deposited on the second layer and less processing time (i.e. lower cost) because the need to include stress compensating layers into the epitaxial deposition of GaN is removed and the growth of the (Al)GaN buffer layer is simplified.

The higher quality results from the lack of stress-generating layers within the group III nitride layer. This reduces the defect density in the group III nitride layer. The first layer or the second layer can easily be deposited epitaxially on the other layer with standard Si epitaxy processes which result in high crystal quality of the layers.

Compared to the deposition of stress compensating layers in the (Al)GaN buffer layer the deposition of a doped Si layer has a higher throughput (lower cost). As a consequence the overall process is simplified and manufacturing cost is lower.

The present invention is described in detail with reference to the three figures.

The layered semiconductor substrate according to the present invention consists of at least three layers:

The monocrystalline first layer 1 contains at least 80% and preferably at least 90% silicon. (All compositions of the layers are given in atom percent herein.) The first layer 1 has a first thickness and a first lattice constant $a_1$. The first lattice constant $a_1$ is determined by a first dopant element and the concentration of this first dopant element (referred to as "first dopant concentration" herein). The crystal lattice orientation is preferably (111).

The monocrystalline second layer 2 also contains at least 80% and preferably at least 90% silicon. It has a second thickness and a second lattice constant $a_2$. The second lattice constant $a_2$ is determined by a second dopant element and the concentration of this second dopant element (referred to as "second dopant concentration" herein).

The second layer 2 is in direct contact with the first layer. There are no further layers between the first layer 1 and the second layer 2. The second layer 2 is deposited in such a way to form a strained heteroepitaxial layer with the actual in-plane lattice constant of the second layer 2 matching the in-plane lattice constant of the first layer 1. Because the second lattice constant $a_2$ is larger than the first lattice constant $a_1$, the second layer 2 is compressively strained with regard to the first layer 1. This causes a convex bow (with regard to the surface of the second layer 2 which is opposite to the first layer 1) prior to the deposition of the third layer 4. This state is shown in FIG. 2.

The monocrystalline third layer 4 (FIG. 3) consists of a nitride of an element of group III of the periodic table (referred to as "group III nitride" in this specification). Of these group III nitrides, aluminium nitride (AlN), gallium nitride (GaN) and indium nitride (InN) and mixtures thereof are of particular importance. Typically, the layered semiconductor substrate comprises more than one group III nitride layer (referred to as "third layer 4"). Preferably, the stack of group III nitride layers starts with an AlN layer in order to chemically isolate the silicon-based substrate, prepare the two-dimensional layer growth and adjust the lattice constant from the lattice constant $a_2$ of the second layer 2 to the lattice constant of the topmost group III nitride layer. Most preferably, the topmost group III nitride consist of GaN.

In the layered semiconductor substrate according to the present invention, the second layer 2 is located between the first layer 1 and the third layer 4. The third layer 4 can be in direct contact to the second layer 2. However, it is also possible to place one or more intermediate layers 3 between the second layer 2 and the third layer 3.

The layered semiconductor structure according to the present invention preferably has the shape of a circular wafer.

Due to the mutual compensation of the strains of the first, second and third layers, the bow of the layered semiconductor substrate is in the range from −50 μm to 50 μm as being defined by ASTM F534 3.1.2 and SEMI MF534. As explained above, the thermal expansion coefficient (TEC) of group III nitrides is larger than that of silicon. Therefore, when a group III nitride layer 4 (FIG. 1) is epitaxially deposited on a silicon substrate 5 at a high temperature and afterwards cooled down to room temperature, the GaN layer 4 contracts more than the silicon substrate 5. This results in a structure having a considerable concave bow as shown in FIG. 1. According to the present invention, this bow (created by the tensile strain of the cooled-down GaN layer) is compensated by a reverse strain in the silicon-based substrate. The structure of the silicon-based substrate is shown in FIG. 2. The silicon-based substrate comprises a first layer 1 having a first lattice constant and a second layer 2, which is in direct contact with the first layer 1 and which has a larger lattice constant than the first layer 1.

In a first embodiment of the present invention, the first and second dopant elements are identical and only the first and second dopant concentrations are different.

In the first embodiment, if the dopant element has a smaller covalent atomic radius than silicon, the first dopant concentration is selected higher than the second dopant concentration. Thus, the first lattice constant $a_1$ becomes smaller than the second lattice constant $a_2$. Boron (B) is a typical dopant element having a smaller covalent atomic radius than silicon and is preferably used in this case. The second dopant concentration may be as low as zero, but the first dopant concentration has to be larger than zero in this case.

In the first embodiment, if the dopant element has a larger covalent atomic radius, the second dopant concentration is selected higher than the first dopant concentration. Thus, the first lattice constant $a_1$ again becomes smaller than the second lattice constant $a_2$. Germanium (Ge) or antimony (Sb) are typical dopant elements having a larger covalent atomic radius than silicon and are preferably used in this case. The first dopant concentration may be as low as zero, but the second dopant concentration has to be larger than zero in this case.

In a second embodiment of the invention, the first and second dopant elements are different elements. In this case, the first dopant element has a smaller covalent atomic radius than silicon and the second dopant element has a larger covalent atomic radius than silicon. Preferably, the first dopant element is boron and the second dopant element is germanium or antimony.

The required amount of strain (resulting in a convex bow of the silicon-based substrate, i.e. the stack of the first layer 1 and second layer 2) is determined by the amount of strain (resulting in a concave bow) caused by the intermediate layer 3 (if any) and by the third layer 4. This amount of concave bow is in turn determined by the thickness, the lattice constant and TEC (and thus by the composition) of the layers 3 and 4. Similarly, the amount of convex bow of the stack of the first layer 1 and second layer 2 depends on the thickness and lattice constant (and thus on the composition) of the layers 1 and 2. Therefore, the thickness and lattice constants (and thus the compositions) of the first layer 1 and second layer 2 are selected such that the required amount of strain is induced in the stack of the first and second layer. Suitable combinations of these parameters can be determined by simple experimentation. By a suitable selection of these parameters, it is possible to obtain a layered semiconductor substrate having a very small bow of −50 µm to 50 µm, preferably of −10 µm to 10 µm.

An upper limit in creating a stressed layer stack of first layer 1 and second layer 2 is reached when the thickness exceeds the critical thickness at a given difference in lattice constant as first predicted by Frank and van der Merve (F. C. Frank and J. H. van der Merve, Proc. Roy. Soc., A198, 216 (1949). For the Si(111) layer structures the critical thickness is not well established and the upper limit has to be tested experimentally, e.g. by measuring bow of the layer stack. Below the critical thickness the bow change can be fitted to the Stoney and Freund equations (see L. B. Freund et al. Appl. Phys. Lett. 74, 1987 (1999)) in order to facilitate the optimization of the final layer structure.

The layered semiconductor substrate according to the present invention can be manufactured by a method comprising the steps of growing a single crystal containing at least 80% silicon and a first dopant element having the first dopant concentration, the single crystal having a first lattice constant, slicing at least one wafer from the single crystal, reducing the thickness of the wafer to the first thickness, the wafer constituting the first layer 1, epitaxially depositing the second layer 2 on one of the surfaces of the wafer, and epitaxially depositing the third layer 4 comprising the group III nitride.

In the first step of the method, a single crystal containing at least 80% silicon and preferably at least 90% silicon is grown. Preferably, the crystal is grown using the well known Czochralski method. If the first dopant concentration is larger than zero, the silicon melt is doped with the first dopant element at a concentration suitable to incorporate the first dopant concentration into the growing silicon single crystal. The grown single crystal has a first lattice constant which depends on the first dopant element and the first dopant concentration. With the Czochralski method, silicon single crystals with a diameter up to 450 mm can be grown at present.

In the second step, at least one wafer is sliced from the single crystal. The method of slicing is not particularly limited according to the present invention. For economic reasons, it is preferred to use a multi-wire saw (MWS) in order to simultaneously slice the single crystal into a multiplicity of wafers.

In the third step, the surface layers of the monocrystalline wafer which were damaged by the slicing step are removed and the thickness of the wafer is reduced to a value equal to the desired first thickness. This is accomplished by a combination of mechanical, chemical and chemo-mechanical treatment steps. Mechanical treatment steps are for example lapping or grinding. Chemical treatment may be liquid-phase etching or gas-phase etching. Polishing is a widely used chemo-mechanical treatment. The resulting wafer constitutes the first layer 1 of the layered semiconductor substrate to be formed.

In the fourth step, the second layer 2 consisting of at least 80% and preferably of at 90% silicon is epitaxially deposited on one of the surfaces of the first layer 1. Preferably, chemical vapour deposition (CVD) is used to deposit the epitaxial second layer. The silicon source gas is preferably trichlorosilane. If the second dopant concentration is larger than zero, an additional source gas for the dopant element has to be provided at a concentration suitable to incorporate the second dopant concentration into the growing epitaxial layer. In case the second dopant element is germanium, germanium tetrachloride ($GeCl_4$) or germane ($GeH_4$) is preferably used as additional source gas.

If necessary, one or more intermediate layers 3 can be epitaxially deposited on the surface of the second layer 2.

In the last step of the method, the third layer 4 consisting of a group III nitride, e.g. AlN, GaN or InN or mixtures thereof is epitaxially deposited on the surface of the second layer 2 (or on the surface of the additional layer 3, if existing). It is also possible (and preferred) to sequentially grow more than one group III nitride layers. Preferably, an AlN seed layer will be grown first using trimethylaluminium ($Al(CH_3)_3$)) and ammonia ($NH_3$) as precursors. Afterwards a graded AlGaN layer with increasing Ga concentration can be used as a transition layer before growing a GaN layer. Typically, trimethylgallium ($Ga(CH_3)_3$)) is used as precursor and the deposition is done using standard MOCVD reactors at growth temperatures between 700° C. and 1200° C.

By means of a suitable selection of the first and second dopant element, first and second dopant concentration and first and second thickness, it is possible to produce a layered semiconductor substrate comprising a group III nitride layer, which has a bow with an absolute value of 50 µm or less or even 10 µm or less.

It is possible to include further steps into the described manufacturing method, e.g. one or more steps for shaping the edge of the wafer (edge rounding, edge polishing), cleaning steps, inspection steps and packaging steps.

The layered semiconductor substrate according to the invention can be used as a substrate for manufacturing electronic devices (e.g. power devices) or optoelectronic devices like light-emitting diodes (LEDs).

The invention claimed is:

1. A layered semiconductor substrate comprising
    a) a monocrystalline first layer (1) containing at least 80% silicon and having a first thickness and a first lattice constant ($a_1$), the first lattice constant ($a_1$) being determined by a first dopant element and a first dopant concentration and
    b) a monocrystalline second layer (2) containing at least 80% silicon and having a second thickness and a second lattice constant ($a_2$), the second lattice constant ($a_2$) being determined by a second dopant element and a second dopant concentration, the second layer (2) being in direct contact with the first layer, and c) a monocrystalline third layer (4) comprising a group III nitride, such that the second layer is located between the first layer and the third layer, wherein the second lattice constant ($a_2$) is larger than the first lattice constant ($a_1$), wherein the crystal lattice of the first layer (1) and the second layer (2) are lattice-matched so that the second layer (2) is strained, and wherein the bow of the layered semiconductor substrate is in the range from −50 μm to 50 μm, and wherein the first and second dopant elements are identical and have a smaller covalent atomic radius than silicon, or wherein the first and second dopant element is antimony, or wherein the first dopant element has a smaller covalent atomic radius than silicon and the second dopant element has a larger covalent atomic radius than silicon.

2. The layered semiconductor substrate of claim 1, wherein the first and second dopant elements are elements having a smaller covalent atomic radius than silicon and wherein the first dopant concentration is higher than the second dopant concentration.

3. The layered semiconductor substrate of claim 2, wherein the first and second dopant element comprises boron.

4. The layered semiconductor substrate of claim 2, wherein the second dopant concentration is zero.

5. The layered semiconductor substrate of claim 3, wherein the second dopant concentration is zero.

6. The layered semiconductor substrate of claim 1, wherein the first and second dopant element is antimony and wherein the second dopant concentration is higher than the first dopant concentration.

7. The layered semiconductor substrate of claim 6, wherein the first dopant concentration is zero.

8. The layered semiconductor substrate of claim 1, wherein the first dopant element is boron and the second dopant element is germanium or antimony.

9. A method for manufacturing a layered semiconductor substrate of claim 1, comprising the steps of a) growing a single crystal containing at least 80% silicon and a first dopant element having the first dopant concentration, the single crystal having a first lattice constant, b) slicing at least one wafer from the single crystal, c) reducing the thickness of the wafer to a first thickness, the wafer constituting the first layer (1), d) epitaxially depositing the second layer (2) on one of the surfaces of the wafer, and e) epitaxially depositing the third layer (4) comprising a group III nitride.

10. The layered semiconductor substrate of claim 1, wherein the first layer comprises a silicon wafer with a crystal orientation of (111).

11. The method of claim 9, wherein the first layer comprises a silicon wafer with a crystal orientation of (111).

12. The layered semiconductor substrate of claim 1, wherein the bow is within the range of −10 μm to 10 μm.

13. The method of claim 9, wherein the bow is within the range of −10 μm to 10 μm.

* * * * *